(12) United States Patent
Inagaki et al.

(10) Patent No.: US 9,704,795 B2
(45) Date of Patent: Jul. 11, 2017

(54) PRINTED WIRING BOARD AND METHOD FOR MANUFACTURING THE SAME

(71) Applicant: IBIDEN CO., LTD., Ogaki-shi (JP)

(72) Inventors: Yasushi Inagaki, Ogaki (JP); Kota Noda, Ogaki (JP)

(73) Assignee: IBIDEN CO., LTD., Ogaki-shi (JP)

(*) Notice: Subject to any disclaimer, the term of this patent is extended or adjusted under 35 U.S.C. 154(b) by 90 days.

(21) Appl. No.: 14/820,963

(22) Filed: Aug. 7, 2015

(65) Prior Publication Data

US 2016/0043027 A1     Feb. 11, 2016

(30) Foreign Application Priority Data

Aug. 7, 2014  (JP) ................................ 2014-161616

(51) Int. Cl.
| | | |
|---|---|---|
| *H01L 23/49* | (2006.01) | |
| *H01L 21/48* | (2006.01) | |
| *H05K 1/02* | (2006.01) | |
| *H05K 3/40* | (2006.01) | |
| *H01L 23/498* | (2006.01) | |
| *H05K 1/11* | (2006.01) | |

(52) U.S. Cl.
CPC .. *H01L 23/49838* (2013.01); *H01L 23/49811* (2013.01); *H05K 1/0278* (2013.01); *H05K 3/4015* (2013.01); *H01L 21/4857* (2013.01); *H01L 23/49827* (2013.01); *H01L 2924/0002* (2013.01); *H05K 1/111* (2013.01); *H05K 2201/0376* (2013.01); *H05K 2201/09827* (2013.01)

(58) Field of Classification Search
CPC ......... H01L 23/49838; H01L 23/49811; H01L 21/4857; H01L 23/49827; H01L 2924/0002; H05K 1/0278; H05K 3/4015; H05K 1/111; H05K 2201/0376; H05K 2201/09827

USPC .......................................................... 361/774
See application file for complete search history.

(56) References Cited

U.S. PATENT DOCUMENTS 9,153,549 B2 * 10/2015 Oyamada .......... H01L 23/49822

FOREIGN PATENT DOCUMENTS

JP        10-173316 A        6/1998

OTHER PUBLICATIONS

U.S. Appl. No. 14/820,978, filed Aug. 7, 2015, Inagaki, et al.

* cited by examiner

*Primary Examiner* — Eric Thomas
*Assistant Examiner* — Michael P McFadden
(74) *Attorney, Agent, or Firm* — Oblon, McClelland, Maier & Neustadt, L.L.P.

(57) ABSTRACT

A printed wiring board includes an insulating layer, a first conductor layer embedded into first surface of the insulating layer and including multiple wirings such that the wirings include connecting portions positioned to connect an electronic component, respectively, a second conductor layer projecting from second surface of the insulating layer on the opposite side, a solder resist layer formed on the first surface of the insulating layer such that the solder resist layer is covering the first conductor layer and has an opening structure exposing the connecting portions of the wirings, and multiple metal posts formed on the connecting portions respectively such that each of the metal posts has a width which is larger than a width of a respective one of the wirings having the connecting portions. The wirings are formed such that the connecting portions are positioned side by side on every other adjacent one of the wirings.

20 Claims, 8 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-161616, filed Aug. 7, 2014, the entire contents of which are incorporated herein by reference.

BACKGROUND OF THE INVENTION

Field of the Invention

The present invention relates to a printed wiring board on which an electronic component is mounted and to a method for manufacturing the printed wiring board. More specifically, the present invention relates to a printed wiring board that allows certainty and reliability of connection between an electronic component and the printed wiring board to be improved and to a method for manufacturing the printed wiring board.

Description of Background Art

Japanese Patent Laid-Open Publication No. HEI 10-173316 describes a structure in which a resin film, on which a conductor circuit pattern is formed, is press-bonded to an insulating substrate and thereafter, by peeling off the resin film, the conductor circuit pattern is embedded in the insulating substrate. The entire contents of this publication are incorporated herein by reference.

SUMMARY OF THE INVENTION

According to one aspect of the present invention, a printed wiring board includes a resin insulating layer, a first conductor layer embedded into a first surface of the resin insulating layer and including multiple wirings such that the wirings include connecting portions positioned to connect an electronic component, respectively, a second conductor layer projecting from a second surface of the resin insulating layer on the opposite side with respect to the first surface of the resin insulating layer, a solder resist layer formed on the first surface of the resin insulating layer such that the solder resist layer is covering the first conductor layer and has an opening structure exposing the connecting portions of the wirings, and multiple metal posts formed on the connecting portions respectively such that each of the metal posts has a width which is larger than a width of a respective one of the wirings having the connecting portions. The wirings are formed such that the connecting portions are positioned side by side on every other adjacent one of the wirings.

According to another aspect of the present invention, a method for manufacturing a printed wiring board includes laminating a metal film on a carrier having a carrier metal layer such that the metal film is laminated on a surface of the carrier metal layer, forming a first conductor layer on the metal film such that the first conductor layer includes multiple wirings including connecting portions positioned to connect an electronic component, forming a resin insulating layer on the metal film such that the first conductor layer is embedded into a first surface of the resin insulating layer, forming a second conductor layer on a second surface of the resin insulating layer on an opposite side of the resin insulating layer with respect to the first layer, removing the carrier from the metal film such that a surface of the metal film is exposed, etching the metal film such that metal posts are formed on the connecting portions of the wirings, respectively, and each of the metal posts has a width which is larger than a width of a respective one of the wirings having the connecting portions, and forming a solder resist layer on the first surface of the resin insulating layer such that the solder resist layer covers the first conductor layer and has an opening structure exposing the metal posts. The forming of the first conductor layer includes forming the wirings such that the connecting portions are positioned side by side on every other adjacent one of the wirings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
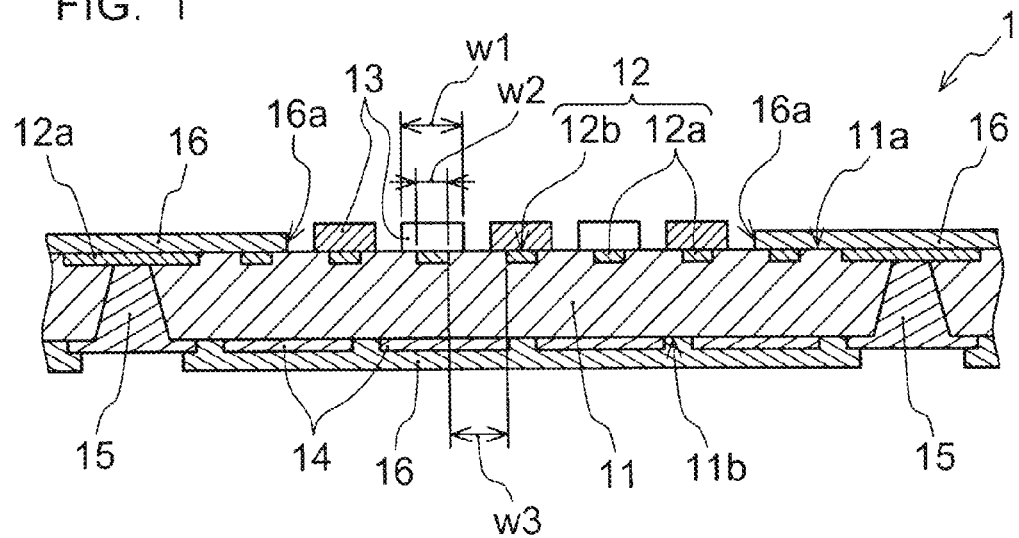
FIG. 1 is an explanatory cross-sectional view of a printed wiring board according to an embodiment of the present invention.

The embodiments will now be described with reference to the accompanying drawings, wherein like reference numerals designate corresponding or identical elements throughout the various drawings.

Figure 5A:
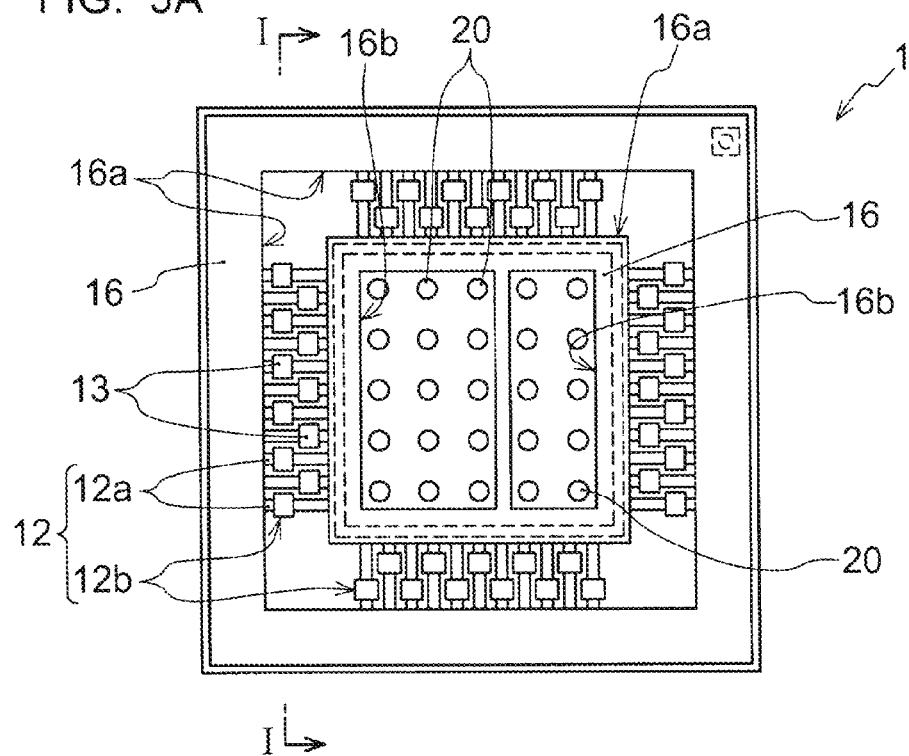
FIG. 5A is an explanatory plan view of the printed wiring board illustrated in FIG. 1.

FIG. 1 is an explanatory cross-sectional view of a printed wiring board 1 of the present embodiment (FIG. 1 illustrates a cross section along a I-I line in FIG. 5A; however, for simplicity, the number of wirings is reduced). In printed wiring board 1 of the present embodiment, a first conductor layer 12 is provided that is embedded on a first surface (11a) side of a resin insulating layer 11 that has the first surface (11a) and a second surface (11b) that is on an opposite side of the first surface (11a). In the first conductor layer 12, multiple wirings (12a) are formed, and an electronic component (not illustrated in the drawings) is electrically connected to portions of the wirings (12a). A second conductor layer 14 is formed on the second surface (11b) of the resin insulating layer 11. Further, a via conductor 15 is formed that penetrates through the resin insulating layer 11 and electrically connects the first conductor layer 12 and the second conductor layer 14. A solder resist layer 16 is formed on the first surface (11a) of the resin insulating layer 11 and on the first conductor layer 12. An opening (16a) is formed in the solder resist layer 16 for exposing respective connecting portions (12b) of the wirings (12a) of the first conductor layer 12 that connect to the electronic component. Metal posts 13 are respectively provided on the connecting portions (12b) that are exposed from the opening (16a). The metal posts 13 are formed to have a width (w1) that is larger than a width (w2) of the wirings (12a) of the connecting portions (12b), and the connecting portions (12b) of every other ones of adjacent wirings (12a) are positioned side by side (see FIG. 5A).

That is, as illustrated in FIGS. 1 and 5A, the wirings (12a) are formed side by side in a row shape, and are embedded in the resin insulating layer 11 so that only one surface of each of the wirings (12a) is exposed. The connecting portions (12b) of the wirings (12a) are formed at positions that are alternately shifted at a constant pitch between adjacent wirings (12a), and the connecting portions (12b) are formed in a so-called zigzag pattern. In other words, when viewed in a same arrangement direction, connecting portions (12b) of every other ones of adjacent wirings (12a) are positioned in a row. The metal posts 13 are respectively formed on the connecting portions (12b).

Figure 2:
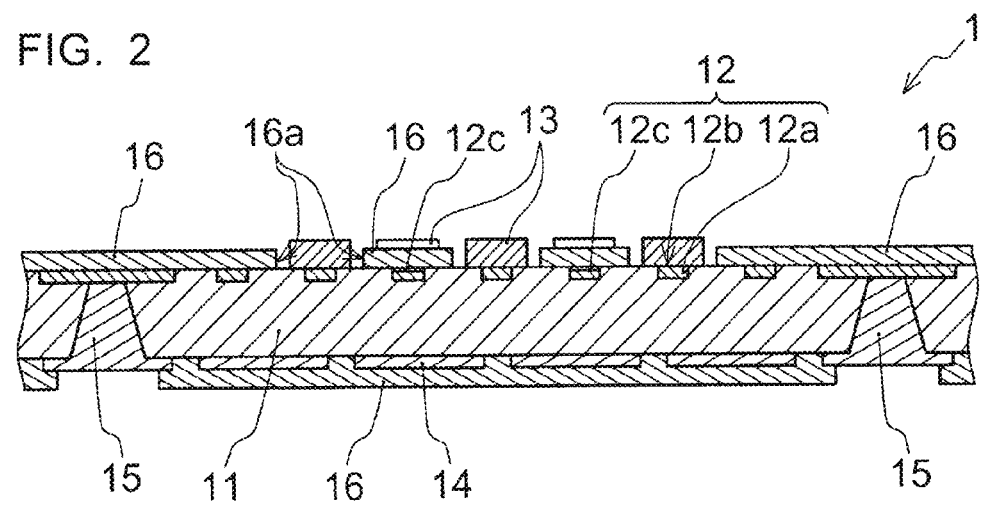
FIG. 2 is an explanatory cross-sectional view of a printed wiring board according to another embodiment of the present invention.
Figure 3:
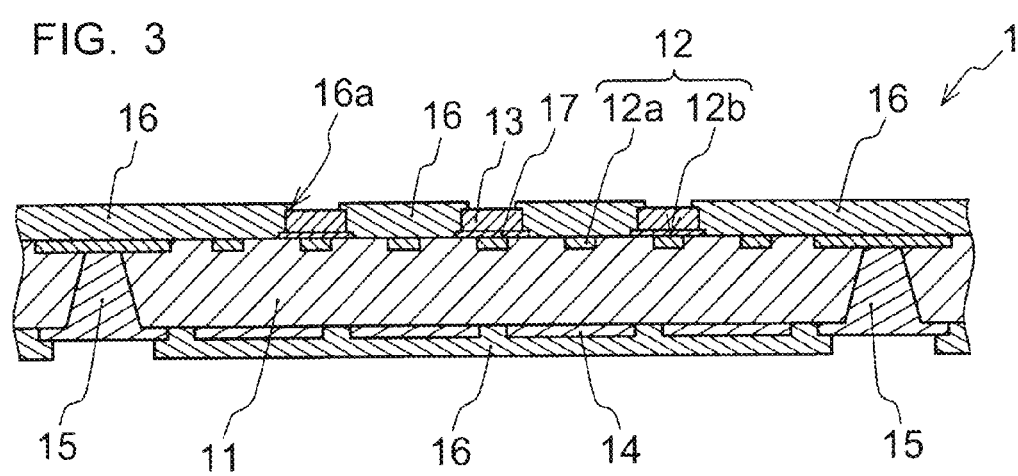
FIG. 3 is an explanatory cross-sectional view of a printed wiring board according to yet another embodiment of the present invention.

In the embodiment illustrated in FIG. 1, only that the metal posts 13 are directly formed on the surface of the first conductor layer 12 and the shape of the opening of the solder resist layer 16 are different from those in structures illustrated in FIGS. 2 and 3; and that the width (w1) of the metal posts 13 is larger than the width of the wirings (12a) of the connecting portions (12b) and that the connecting portions (12b) of every other ones of adjacent wirings (12a) are positioned side by side are in common with the structures illustrated in FIGS. 2 and 3. A relation between the structures of the metal posts 13 and the connecting portions (12b) of the wirings (12a) and the opening (16a) of the solder resist layer 16 has no meaning to a combination thereof, and they can be mutually independently combined. That is, the structure of the solder resist layer 16 near a connecting portion (12b) illustrated in FIG. 1 may also be the structure illustrated in FIG. 3; and, the structure of the solder resist layer 16 illustrated in FIG. 3 may also be a structure in which a barrier metal layer 17 (to be described later) is absent. The structures that have no relation to each other are simply illustrated in one drawing.

In the present embodiment, as described above, the metal posts 13 having the width (w1) larger than the width (w2) of the wirings (12a) are respectively formed on the wirings (12a). The connecting portions (12b) of adjacent wirings (12a) are formed at positions of which every other one is shifted. Therefore, even when the large metal posts 13 are formed on the narrow wirings (12a), contact between the connecting portions (12b) of the adjacent wirings is unlikely to occur. An electronic component or the like is connected to the metal posts 13 that are formed to have a large size. Therefore, the connecting portions (12b) of the wirings (12a) and the electronic component or the like can be reliably connected. In addition, the metal posts 13 are formed to have a high height. Therefore, even when the electronic component or the like and the resin insulating layer 11 have different thermal expansion coefficients, a thermal stress can be easily absorbed by the metal posts 13, and connection strength and reliability can be further improved. In particular, the metal posts 13 are each formed in a curved shape that is thick on a bottom surface side (the wiring (12a) side) and is narrow on an upper surface side (opposite side of the bottom surface side). Thereby, a stress can be more easily absorbed, and an area of a portion soldered to the electronic component or the like can be reduced while the connection to the wirings (12a) can be sufficiently performed. Therefore, a risk of occurrence of contact can be further suppressed. As a result, very highly reliable electrical connection to the electronic component or the like can be achieved.

Further, the size of the metal posts can be easily adjusted by a patterning mask. Therefore, in a case such that where warpage occurs in the resin insulating layer when temperature rises during solder reflow during mounting, by adjusting the size of the metal posts, a height of solder bumps or the like can be adjusted and a connection failure or the like due to the warpage during mounting can be prevented.

Figure 5B:
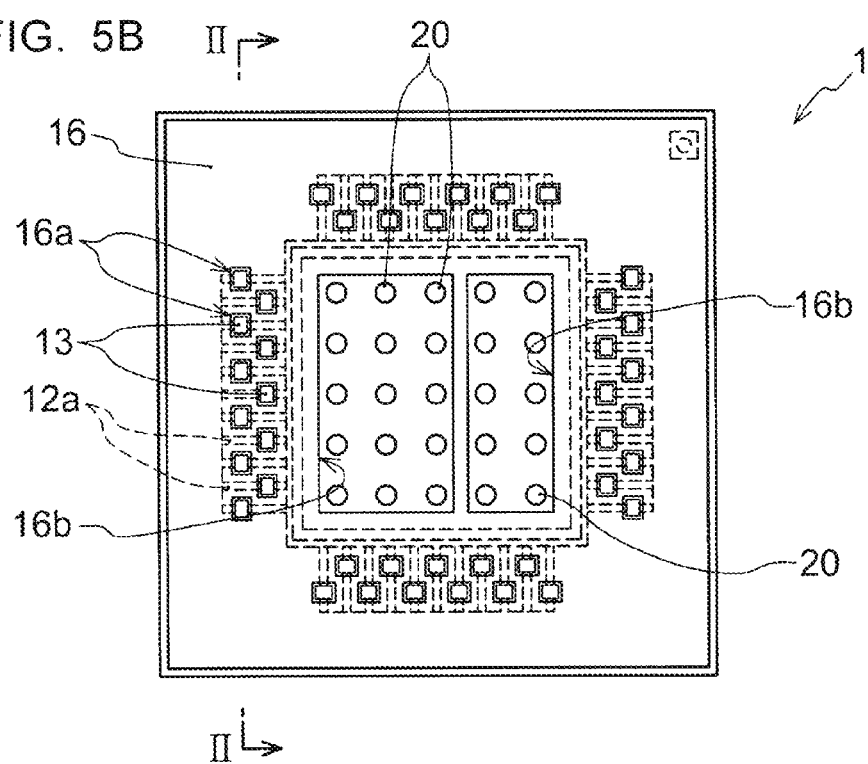
FIG. 5B is an explanatory plan view of the printed wiring board illustrated in FIG. 2.

Further, as described in a manufacturing method (to be described later), the metal posts 13 may be a metal film which is on a carrier in manufacturing a printed wiring board and which is eventually discarded. That is, using a slightly thicker metal film than one discarded, by patterning and letting portions of the metal film remain, the metal posts 13 may be formed. Therefore, there is substantially no increase in material and there is also no significant increase in processes. Every other ones of the positions of the connecting portions (12b) are shifted. Therefore, for example, in FIG. 2 that illustrates a cross-sectional view along an II-II line in FIG. 5B, in a portion that is not a connecting portion, a cross section of the solder resist layer 16 is visible, and a metal post 13 is visible behind the cross section.

The embodiment illustrated in FIG. 2 is different from the embodiment illustrated in FIG. 1 in that a recess (12c) that is recessed relative to the first surface (11a) of the resin insulating layer 11 is formed in a portion of each of the wirings (12a) that is exposed, and in that an opening (16a) of the solder resist layer 16 is individually formed for each of the connecting portions (12b). The solder resist layer 16 of the embodiment illustrated in FIG. 3 also has openings that are individually formed for the connecting portions (12b). However, there is a difference that, in the embodiment illustrated in FIG. 2, each opening (16a) is formed such that an entire metal post 13 is exposed in the opening (16a), whereas in the example illustrated in FIG. 3, a peripheral portion of each of the metal posts 13 is also covered by the solder resist layer 16. As described above, the shape of the opening of the solder resist layer 16 and the structure of the metal post 13 are completely independent of each other and are not limited to the structures illustrated in the drawings.

Further, the embodiment illustrated in FIG. 2 is characterized in that the recess (12c) is formed on the surface of the portion of the first conductor layer 12 where a metal post 13 is not provided. That is, because an electrical resistance is small and formation of an electroplating film is easy, copper is often used as a material of the metal posts 13 and the first conductor layer 12. However, in a case where the metal posts 13 and the first conductor layer 12 are both made of the same material, when the metal posts 13 are formed by, for example, etching a metal film (13a) (to be described later) and the metal film (13a) is not completely removed by etching, short circuits occur between the wirings (12a). Therefore, etching may be stopped until the metal film (13a) is completely removed. However, when the metal film (13a) is not completely removed due to etching unevenness and the like, at those portions, short circuits occur between the wirings (12a). Therefore, etching is performed until the recesses (12c) are formed, and thereby the short circuit problem can be completely removed. As a result, the exposed portion of the first conductor layer 12 is slightly etched and it is possible that the surface is recessed relative to the first surface (11a) of the resin insulating layer 11.

In the embodiment illustrated in FIG. 3, the barrier metal layer 17 that is made of a material different from that of the first conductor layer 12 and the metal posts 13 is interposed between the first conductor layer 12 and the metal posts 13. By providing such a barrier metal layer 17 made of a metal different from that of the first conductor layer 12 and the like, when the metal posts 13 are formed by etching the metal film (13a) (to be described later), the barrier metal layer 17 is also completely removed while the metal film (13a) is completely patterned. In the example illustrated in FIG. 3, the barrier metal layer 17 extends to an outer side of the outer periphery of each of the metal posts 13. In this way, to have a pattern different from that of the metal posts 13, a mask such as a resist mask is newly formed. However, since the outer side of the first conductor layer 12 is also covered, infiltration by an etching solution or the like is completely prevented, and thus it is preferable. However, it is also possible that the metal posts 13 that are formed by etching are directly used as mask to form the barrier metal layer 17 by etching. Without the need to newly provide a mask, only the barrier metal layer 17 that is exposed on the surfaces of the first conductor layer 12 and the resin insulating layer 11 is completely removed. In a high-frequency circuit or the like, due to the skin effect, an current flows only near a surface. Therefore, it is desirable that a coating having a large electrical resistance be not formed on the surface. From this point of view, it is preferable that the barrier metal layer 17 that is exposed on the surface be removed as much as possible. However, the barrier metal layer 17 is only interposed in areas of the connecting portions (12b) and thus is not causing a problem.

Figure 5C:
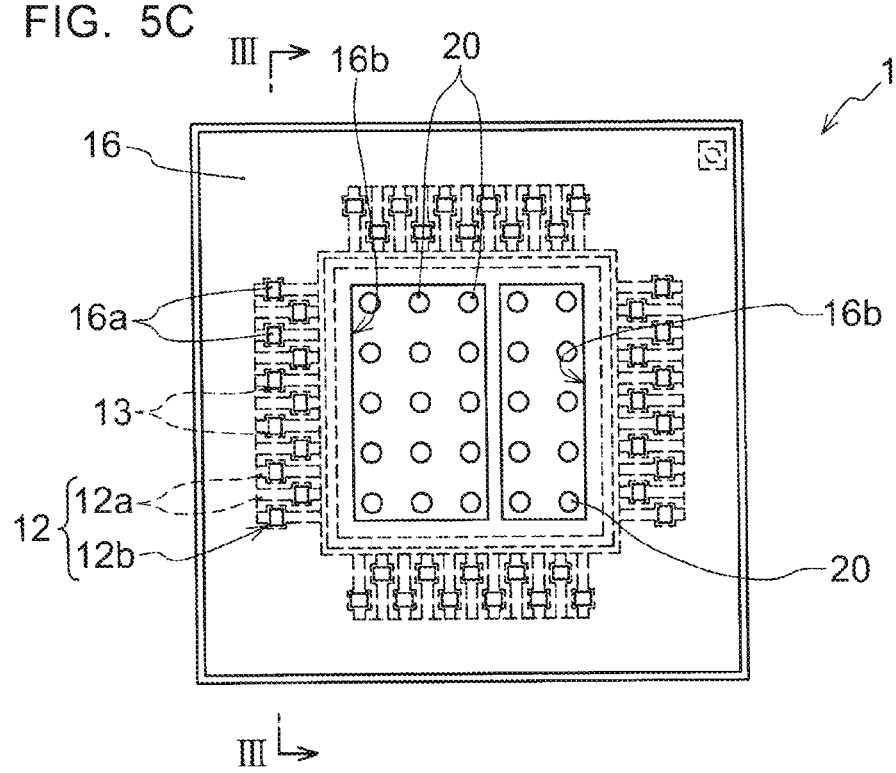
FIG. 5C is an explanatory plan view of the printed wiring board illustrated in FIG. 3.

FIG. 3 illustrates a cross-sectional view along a line in FIG. 5C (also for this figure, the number of the wirings (12a) in FIG. 3 does not match that in FIG. 5C). As is apparent from FIGS. 3 and 5C, the openings (16a) of the solder resist layer 16 are individually formed for the connecting portions (12b) and the openings (16a) are formed such that a peripheral portion of each of the metal posts 13 is also covered by the solder resist layer 16. That is, in FIG. 2, the metal posts 13 are respectively exposed from the openings (16a). However, in the example illustrated in FIG. 3, the openings (16a) are formed such that a portion of each of the metal posts 13 is exposed.

In the embodiment illustrated in FIG. 3, during the etching of the metal posts 13, due to the presence of the barrier metal layer, that the first conductor layer 12 is excessively etched does not occur. On the other hand, etching residue of the metal film (13a) is also unlikely to occur. Therefore, it is possible that only the metal film at a necessary location is removed by etching. Further, the barrier metal layer 17 is formed in contact with the first surface (11a) of the resin insulating layer 11 and thus can be formed in accordance with a desired characteristic impedance of the first conductor layer 12. That is, the barrier metal layer 17 can be allowed to remain in a desired pattern.

Further, as illustrated in FIG. 3, the barrier metal layer is interposed between the metal posts 13 and the first conductor layer 12. Thereby, on the lower side of the metal posts 13, the wirings (12a) may be formed to have a wide width. That is, in a portion where the barrier metal layer 17, even when a width of a wiring (12a) is wide, it does not cause a problem as long as the width of the wiring (12a) does not exceed a width of the barrier metal layer 17. On the other hand, when the width of the wirings (12a) is wide, electrical connection between the wirings (12a) and the barrier metal layer 17 is good. Further, even when the barrier metal layer 17 is absent, as long as a wiring (12a) has a size that does not exceed a projected area of a metal post 13, the wiring (12a) can have a width wider than a width of a neighboring wiring (12a). By having this structure, the reliability of the connection between the metal post 13 and the wiring (12a) is improved. Further, in the structure illustrated in FIG. 3, the solder resist layer 16 is formed such that only a central portion of each of the metal posts 13 of the connecting portions (12b) is exposed. Therefore, any possibility of contact between the connecting portions (12b) of adjacent wirings (12a) is completely eliminated. A metal post 13 at a connecting portion (12b) is formed to be larger than a wiring (12a) at the connecting portion (12b). Therefore, even when a peripheral portion of the metal post 13 is covered by the solder resist layer 16, even when an electrode of an electronic component or the like is connected, contact between adjacent wirings (12a) can be reliably prevented while a sufficient area of a connecting portion is ensured.

The resin insulating layer 11 is an insulating layer that has the first surface (11a) and the second surface (11b) that is on the opposite side of the first surface (11a). The resin insulating layer 11, for example, may be formed by impregnating a core material such as glass fiber with a resin composition that contains a filler, and may also be formed using a resin composition alone that contains a filler. Further, the resin insulating layer 11 may be formed to be a single layer and may also be formed from multiple insulating layers. When the resin insulating layer 11 is formed from multiple insulating layers, for example, a thermal expansion coefficient, flexibility and a thickness of the resin insulating layer 11 can be easily adjusted. Examples of the resin include epoxy and the like. The thickness of the resin insulating layer 11, for example, is in a range of 25-100 μm. The first conductor layer 12 is exposed on the first surface (11a). The solder resist layer 16 is formed on the wirings (12a) other than the connecting portions (12b) on which an electronic component is mounted and on the first surface (11a) of the resin insulating layer 11 surrounding the wirings (12a) such that portions of the wirings (12a) on which the electronic component is mounted are exposed from the openings (16a) of the solder resist layer 16. The second conductor layer 14 (to be described later) is formed on the second surface (11b) of the resin insulating layer 11.

The first conductor layer 12 is a pattern of the wirings (12a) that are embedded on the first surface (11a) side of the resin insulating layer 11. One surface of the embedded first conductor layer 12 is exposed substantially flush with the first surface (11a) of the resin insulating layer 11. In this way, embedding the first conductor layer 12 in the resin insulating layer 11 contributes to reduction in a thickness of the printed wiring board 1 and contributes to improvement in adhesion between the first conductor layer and the resin insulating layer 11. Further, it also has an advantage of being able to adapt to fine wiring. On the other hand, as will be described later, when a non-uniform solder resist layer 16 is formed on the first surface (11a) and on the second surface (11b), there is a problem that warpage is likely to occur in the resin insulating layer 11. However, in the present embodiment, an impact due to the warpage on connection reliability of an electronic component or the like is reduced. Examples of the electronic component include semiconductor elements such as a discrete device and an IC. A method for forming the first conductor layer 12 is not particularly limited. Preferably, the first conductor layer 12 may be an electroplating film formed by electroplating. When the first conductor layer 12 is an electroplating film, there is an advantage that the first conductor layer 12 is formed as a pure metal film. Copper is an example of a material of which the first conductor layer 12 is formed. Copper allows electroplating to be easily performed and has a small electrical resistance, and a corrosion problem is also unlikely to occur. The first conductor layer 12 has a thickness, for example, in a range of 3-20 μm.

Figure 5D:
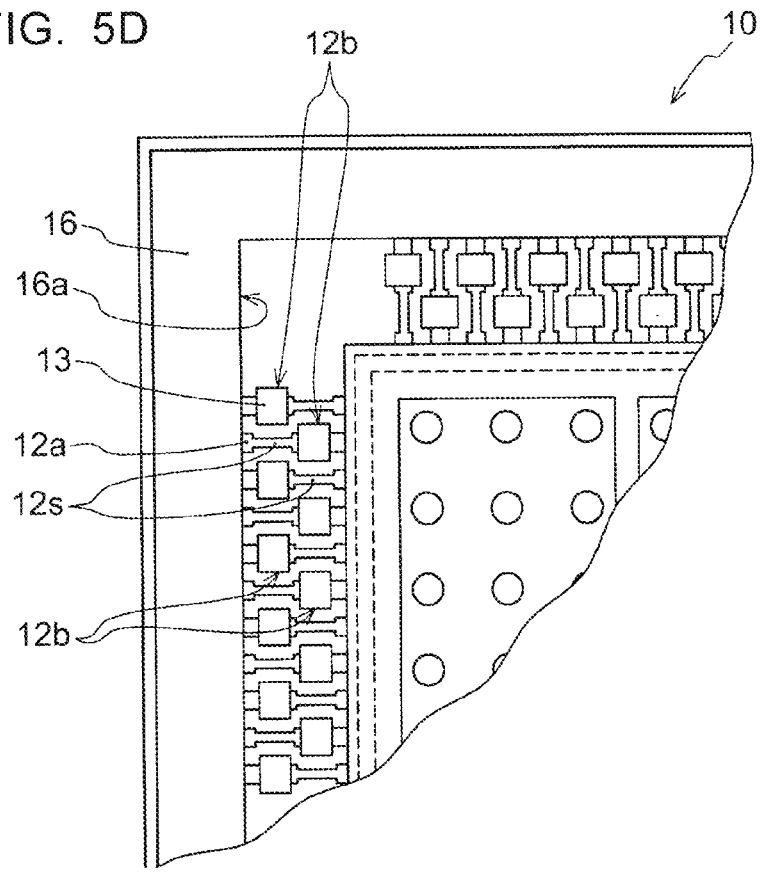
FIG. 5D is an explanatory plan view illustrating another embodiment of a wiring pattern illustrated in FIG. 1.

When an interval between the wirings (12a) is narrow and the metal posts 13 are formed large, there is a possibility that contact between adjacent wirings (12a) may occur. In such a case, for example, as illustrated in an enlarged partial explanatory plan view of FIG. 5D, from a point of view of preventing a contact incident, it is preferable that wiring portions (12s) that are respectively positioned between the connecting portions (12b) of the wirings (12a) (the connecting portions (12b) being positioned in the zigzag pattern) be formed thin. The wiring portions (12s) that are formed thin are each formed to have a width of about ⅔-½ of the normal width of the wirings (12a). Even when the wirings (12a) are somewhat thin, since the wirings (12a) are embedded in the resin insulating layer 11, there is no risk of disconnection and a risk of contact between the wirings can be avoided.

The metal posts 13 are respectively formed on the connecting portions (12b) of the wirings (12a) that are formed in the first conductor layer 12, the connecting portions (12b) being exposed in the openings (16a) of the solder resist layer 16, and an electronic component being mounted on the connecting portions (12b). With regard to the metal posts 13, as illustrated in the above-described FIG. 3, the barrier metal layer 17 may be provided between the metal posts 13 and the first conductor layer 12. This point will be described later. The metal posts 13 are formed to have the width (w1) that is larger than the width (w2) of the wirings (12a) at the connecting portions (12b) on which the metal posts 13 are formed. That is, the wirings (12a) of the printed wiring board 1 are fine-pitched and the wirings (12a) are each formed thin. In addition, the interval between the wirings (12a) is narrow. However, the metal posts 13 are respectively formed to be larger than the wirings (12a). Therefore, even in the case where an electronic component or the like is mounted on the metal posts 13, connection to the electronic component or the like can be easily performed. For example, the width (w1) of each of the metal posts 13 is about 20 μm; and the width (w2) of each of the wirings (12a) is about 10 μm. Further, an interval (w3) between adjacent wirings (12a) is about 10 μm. Therefore, an interval between an edge of a metal post 13 and an adjacent wiring (12a) is about 5 μm, which is very narrow. However, as described above, the connecting portions (12b) are formed at the positions that are shifted at a constant pitch between adjacent wirings (12a) (see FIG. 5A). Therefore, the connecting portions (12b) can be formed to be exposed without causing contact between adjacent wirings (12a).

Each of the metal posts 13 may be formed to be a single layer and may also be formed from multiple layers. When each of the metal posts 13 is formed from multiple layers, examples of the layers include Cu/Ni, Cu/Ti, Au/Pd/Ni, and Au/Ni. Ni or Ti that is provided as an outermost layer can function as a surface protection film.

The metal posts 13 may each have a height (thickness) that allows warpage in the resin insulating layer 11 to be relaxed when an electronic component is mounted, the warpage being due to rise and fall of temperature when the printed wiring board is incorporated in an electronic device and is used. That is, when the wirings (12a) to which an electronic component is connected are formed only by the first conductor layer 12, a large portion excluding the surface of the first conductor layer 12 is covered by the resin insulating layer 11. Therefore, when warpage occurs in the printed wiring board 1 due to imbalance of the solder resist layers 16 on the first surface (11a) and the second surface (11b) of the resin insulating layer 11, a stress due to a difference in thermal expansion coefficient acts only on a soldering portion of the electronic component, and there is a risk that the soldering portion becomes unable to withstand the stress and is damaged. However, the metal posts 13 are provided. Thereby, the periphery of each of the metal posts 13 are in contact with an open space, and thus the stress can be easily absorbed by expansion and contraction of the metal posts 13. The height of the metal posts 13 is, for example, preferably 10-20 μm, and more preferably about 18 μm. That the height of the metal posts 13 is larger than the thickness of the solder resist layer 16 is preferable in that thickness reduction can be achieved while a stress can be relaxed.

A stress is easily absorbed not only by increasing the height of the metal posts 13 but also by devising the shape of the metal posts 13. For example, as depicted in enlarged views illustrated in FIGS. 4A and 4B in which the thickness of the metal posts 13 is exaggerated, a stress is easily absorbed by forming the metal posts 13 to have a shape in which a side surface of each of the metal posts 13 is curved.

Figure 4A:
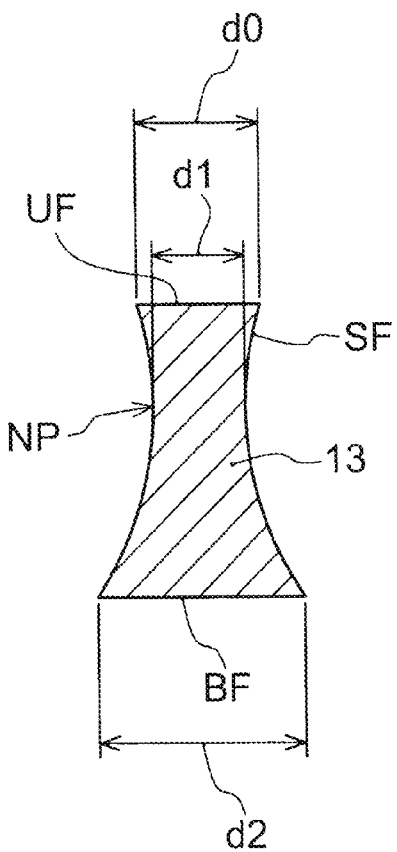
FIG. 4A is an enlarged explanatory cross-sectional view for describing a shape of a metal post, in which a dimension in a thickness direction is exaggerated.

That is, in a structure illustrated in FIG. 4A, a metal post 13 has an upper surface (UF), a lower surface (BF) on an opposite side of the upper surface, and a side surface (SF) between the upper surface and the lower surface. The side surface (SF) is curved. It is preferable that a diameter (d0) of the metal post 13 at the upper surface (UF) be smaller than a diameter (d2) of the metal post 13 at the lower surface (BF). In FIG. 4A, a thinnest portion (NP) exists between the upper surface (UF) and the lower surface (BF), and a diameter (d1) of the thinnest portion (NP) is smaller than the diameter (d0) at the upper surface (UF) and is smaller than the diameter (d2) at the lower surface (BF).

Figure 4B:
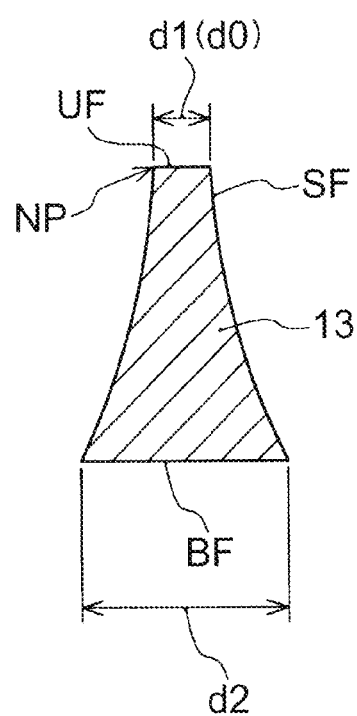
FIG. 4B is an enlarged explanatory cross-sectional view for describing a shape of a metal post, in which a dimension in a thickness direction is exaggerated.

In the example illustrated in FIG. 4B, the diameter of the metal post 13 increases from the upper surface (UF) toward the lower surface (BF). In FIG. 4B, the thinnest portion (NP) is formed at the upper surface (UF) of the metal post 13, and thus d1=d0. The shape of the side surface of each of the metal posts 13 is not straight but curved. Therefore, a stress caused by a difference in physical properties between the printed wiring board 1 and an electronic component or the like mounted on the printed wiring board is relaxed by the metal posts 13. Examples of the physical properties include thermal expansion coefficient, Young's modulus, and the like. The shape of FIG. 4A is more suitable for stress relaxation than the shape of FIG. 4B. Such shapes can be obtained by adjusting an etching condition or the like. Therefore, by controlling the thickness and the shape of the metal posts 13, a stress is further relaxed.

As illustrated in the above-described FIG. 3, it is also possible to have a structure in which the barrier metal layer 17 and the metal posts 13 are formed on the surfaces of the wirings (12a) (among the connecting portions (12b) of the wirings (12a)) that are exposed in the openings (16a) of the solder resist layer 16 and on which an electronic component is mounted. The barrier metal layer 17 is formed of a material different from those of the metal posts 13 and the first conductor layer 12. Examples of the material include nickel, titanium and the like. The barrier metal layer 17 functions as a barrier layer so that, when the metal posts 13 are patterned and formed from the metal film (13a), the first conductor layer 12 that is normally formed of the same material as that of the metal posts 13 is not etched. In particular, as will be described later, when the metal posts 23 become thick, it is difficult to precisely perform etching control. However, by providing the barrier metal layer 17, the metal posts 13 are accurately formed without any risk of over etching the first conductor layer 12. It is sufficient for the barrier metal layer 17 to have a thickness of about a few micrometers (μm).

The second conductor layer 14 is formed projecting from the second surface (11b) of the resin insulating layer 11. A method for forming the second conductor layer 14 is not particularly limited. Copper is an example of a material of which the second conductor layer 14 is formed. The second conductor layer 14 has a thickness, for example, in a range of 3-20 μm. The second conductor layer 14 is illustrated as an example of a single layer in FIG. 1. However, as will be described later, for example, the second conductor layer 14 may also be formed by a metal foil and a plating film.

The via conductor 15 penetrates through the resin insulating layer 11 and electrically connects the first conductor layer 12 and the second conductor layer 14. The via conductor 15 is formed by filling a conductor in a through hole (11d) that penetrates through the second conductor layer 14 and the resin insulating layer 11. As a material for the via conductor 15, copper is used as an example. The via conductor 15 is formed, for example, by electroplating.

The solder resist layer 16 is formed on the first conductor layer 12 and on the first surface (11a) of the resin insulating layer 11 in a range excluding the wirings (12a) of the first conductor layer 12 on which electrodes of an electronic component are connected. In the example illustrated in FIG. 1, the solder resist layer 16 is not formed in an entire region of the wirings (12a), but is formed in an entire surrounding region excluding a range of the opening (16a). In the example illustrated in FIG. 1, the opening (16a) is formed as a collective opening that is formed such that the connecting portions (12b) of the wirings (12a) are positioned in a zigzag pattern and are exposed. However, as illustrated in the above-described FIGS. 2 and 3, it is also possible to form separate openings. Further, a second opening (16b) is formed so that a C4 pad 20 is exposed. An example of a material of which the solder resist layer 16 is formed is thermosetting epoxy resin. The solder resist layer 16 is formed to have a thickness of, for example, about 20 μm.

As described above, according to the present embodiment, the metal posts 13 are provided on the first conductor layer 12 on which an electronic component is mounted. Therefore, even when warpage occurs in the resin insulating layer 11, when the occurrence of the warpage can be predicted, the pattern of the metal posts 13 can be increased or reduced in size. For wirings (12a) of which an interval is increased due to the warpage, it is also possible that the size of the metal posts 13 is reduced and rise of the metal posts 13 is increased. By devising this way, a connection failure can be avoided. Further, without being embedded in the resin insulating layer 11, the metal posts 13 project from the surface of the resin insulating layer 11. Therefore, the metal posts 13 can easily adapt to expansion and contraction and thus can function as a relaxation layer that absorbs a stress. Therefore, not only yield reduction due to connection failure during mounting is prevented, but also occurrence of cracking or the like due to heat cycles after use is prevented and the reliability is significantly improved.

Next, a manufacturing method of the present embodiment is described. A difference between FIGS. 1 and 2 and FIG. 3 is only the presence or absence of the barrier metal layer 17. Therefore, a manufacturing method of the embodiment of FIG. 3 in which the barrier metal layer 17 is present is described. In the embodiments of FIGS. 1 and 2, the manufacturing method is substantially the same as that of FIG. 3 except that the barrier metal layer 17 is not provided.

Figure 6A:
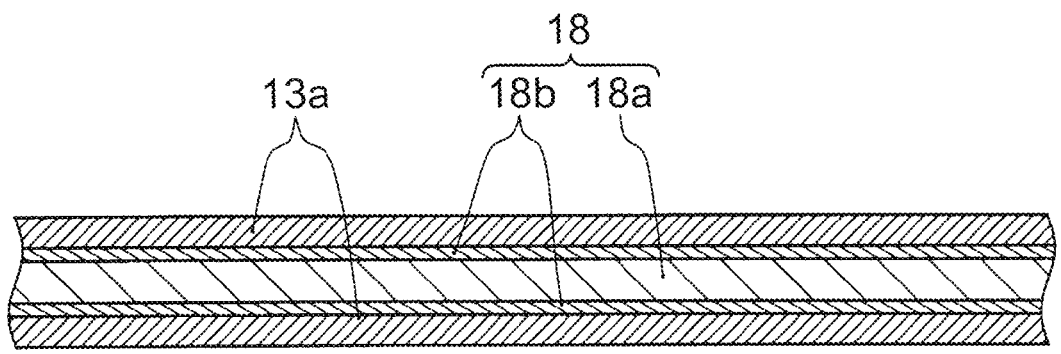
FIG. 6A is an explanatory cross-sectional view illustrating a process of a method for manufacturing the printed wiring board illustrated in FIG. 3.

First, as illustrated in FIG. 6A, a carrier 18 is prepared on which the metal film (13a) is provided. As the carrier 18, for example, a copper-clad laminated plate is used. However, the present invention is not limited to this. In the example illustrated in FIG. 1, for example, the metal film (13a) with a carrier copper foil (18b) is affixed using an adhesive or using a thermal compression bonding method or the like to both sides of a support plate (18a) that is formed of, for example, a prepreg. Thereby, on both sides of the support plate (18a), for example, the carrier copper foil (18b) is affixed and the carrier 18 is formed. For example, the metal film (13a) is formed to have a thickness of 5-20 μm and preferably 10-20 μm, and the carrier copper foil (18b) is formed to have a thickness of 15-30 μm and preferably about 18 μm.

The carrier 18 is used as a substrate during processing of the following processes and, as will be described later, will be removed without being left as a printed wiring board. Therefore, in order for the carrier 18 to be separated from the first conductor layer 12 and the like, the metal film (13a) is provided on the surface of the carrier 18. However, the metal film (13a) is bonded to or fixed on the carrier 18 over the entire surface via an easily separable adhesive such as a thermoplastic resin or the like interposed between the metal film (13a) and the carrier 18 so that the metal film (13a) is easily separable from the carrier 18. That is, the carrier copper foil (18b) and the metal film (13a) are bonded over the entire surface by a thermoplastic resin or the like to form the metal film (13a) with the carrier copper foil (18b), and the carrier copper foil (18b) is bonded to the support plate (18a) by thermal compression bonding or the like. By being bonded by the thermoplastic resin, even when being bonded over the entire surface, the metal film (13a) and the carrier copper foil (18b) can be easily separated from each other due to a temperature rise. However, without being limited to this, for example, it is also possible that the metal film (13a) and the carrier copper foil (18b) are bonded or fixed to each other over only a surrounding area. By being fixed to each other over the surrounding area, the two can be easily separated from each other by cutting the surrounding area. Therefore, the fixation in the surrounding area in this case is not limited to using the thermoplastic resin. It is desirable that there be no difference in thermal expansion and the like between the carrier 18 and the metal film (13a). Therefore, when nickel is used for the metal film (13a), it is preferable that the carrier copper foil is also formed of the same material such as a carrier nickel foil. Therefore, a release layer may be suitably provided on the surface of the carrier 18 on which the metal film (13a) is provided.

In the example illustrated in FIG. 6A, the metal film (13a) with the carrier copper foil, which is obtained by bonding the carrier copper foil (18b) and the metal film (13a) in advance using an adhesive or the like, is affixed to the support plate (18a). However, it is also possible that the metal film (13a) is bonded over the entire surface or in the surrounding area or the like to the carrier 18 that is obtained by affixing the carrier copper foil (18b) or the like to the support plate (18a). Further, an example is illustrated in which the metal film (13a) is provided on both sides of the carrier 18. This is preferable in that two printed wiring boards are manufactured at once utilizing both sides of the carrier 18 that is to be discarded. However, it is also possible that only one side of the carrier 18 is used, or different circuit patterns are formed on the two sides. In an example described below, the same circuit pattern is formed on the both sides. Therefore, although both sides are illustrated in the drawings, only one side is described, and, with regard to the other side, reference numerals and description are partially omitted.

Figure 6B:
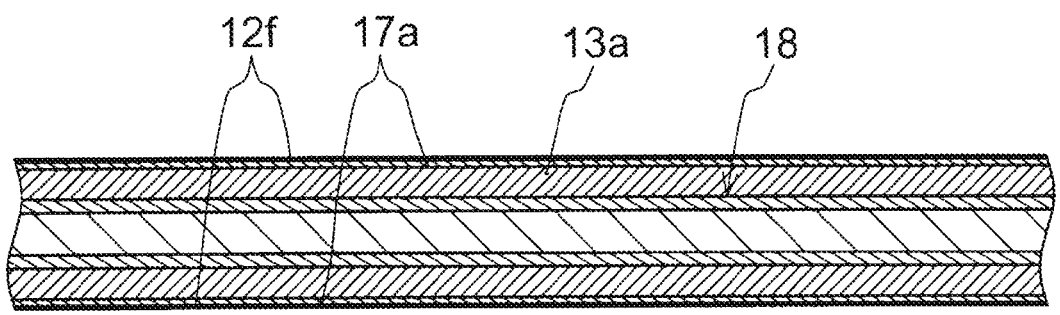
FIG. 6B is an explanatory cross-sectional view illustrating a process of the method for manufacturing the printed wiring board illustrated in FIG. 3.

As illustrated in FIG. 6B, a barrier metal film (17a) is formed on a surface of the metal film (13a), and a metal coating (12f) is further formed on a surface of the barrier metal film (17a). As described above, the barrier metal film (17a) is for preventing the first conductor layer under the metal film (13a) from being over etched and the wirings (12a) from becoming too thin even when the metal film (13a) vanishes when the metal film (13a) is etched and patterned. The barrier metal film (17a) is formed of a material different from those of the metal film (13a) and the first conductor layer 12. For example, a copper material may be used for the metal film (13a) and the first conductor layer 12. Therefore, it is preferable that a nickel or tin film be used as the barrier metal film (17a), and the barrier metal film (17a) be formed using an electroplating method. The nickel film is easily oxidized. Therefore, it is preferable that a thin metal coating be formed, for example, by electroless plating after the nickel film (17a) is formed so that a resistive component is not incorporated as much as possible into the nickel film. The metal coating (12f) is formed so that a surface is kept clean and an oxide film is not formed. It is preferable that a film such as a copper coating that is stable and has a small electrical resistance be formed using other methods such as vacuum deposition. For example, by forming a copper coating, electroplating is easily performed using the metal coating as a seed layer. The metal coating (12f) is not required. However, as described above, the nickel plating film (17a) is easily oxidized. Therefore, it is preferable that a stable metal coating be formed on the surface of the nickel plating film (17a) using an electroless plating method or vacuum deposition.

Figure 6C:
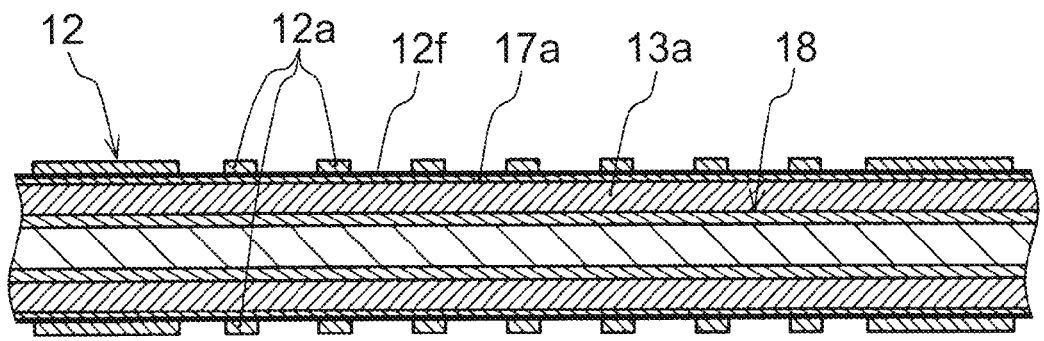
FIG. 6C is an explanatory cross-sectional view illustrating a process of the method for manufacturing the printed wiring board illustrated in FIG. 3.

As illustrated in FIG. 6C, electroplating is performed using the metal coating (12f) as one of electrodes. That is, the first conductor layer 12 is formed that includes the wirings (12a) and the like on which an electronic component is mounted. A method for forming the first conductor layer 12 is as follows. A resist pattern (not illustrated in the drawings) for forming a predetermined pattern is formed on the surface of the metal coating (12f). For example, copper plating is performed on a portion where the metal coating (12f) is exposed using an electrolytic copper plating method using the metal film (13a) or the metal coating (12f) as one of the electrodes. Thereby, the first conductor layer 12 is formed. Thereafter, by removing the resist pattern, the first conductor layer 12 is formed on the barrier metal film (17a) via the metal coating (12f) as illustrated in FIG. 6C.

Figure 6D:
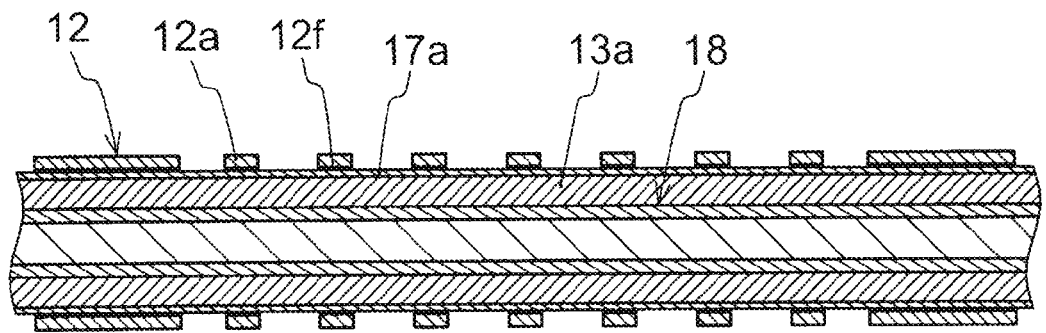
FIG. 6D is an explanatory cross-sectional view illustrating a process of the method for manufacturing the printed wiring board illustrated in FIG. 3.

As illustrated in FIG. 6D, the resist pattern is removed, and the metal coating (12f) that is formed from electroless plating and the like and is exposed is removed by etching. The metal coating (12f) is very thin, and thus is removed by subjecting the entire surface to light etching without masking the surface of the first conductor layer 12. As a result, the metal coating (12f) remains only between the barrier metal film 17 and the first conductor layer 12, and is removed in other places.

Figure 6E:
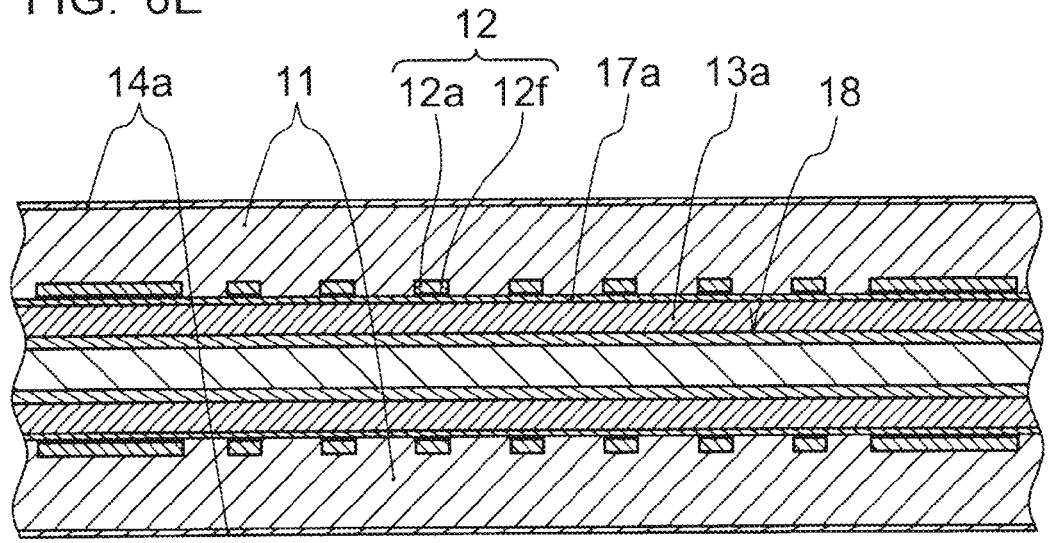
FIG. 6E is an explanatory cross-sectional view illustrating a process of the method for manufacturing the printed wiring board illustrated in FIG. 3.

As illustrated in FIG. 6E, the resin insulating layer 11 and a metal foil (14a) that becomes a part of the second conductor layer 14 are laminated on the first conductor layer 12 and on the surface of the metal coating (12f) that is exposed. For the lamination of the resin insulating layer 11 and the metal foil (14a), a method may be used, in which bonding is performed by applying pressure and heat.

Next, the through hole (11d) is formed. As a method for forming the through hole (11d), a method of laser irradiation is used. That is, the through hole (11d) is formed at a portion where the first conductor layer 12 and the second conductor layer 14 that are provided on the two sides of the resin insulating layer 11 are connected, and is processed by irradiating $CO_2$ laser or the like from the surface of the metal foil (14a).

Figure 6F:
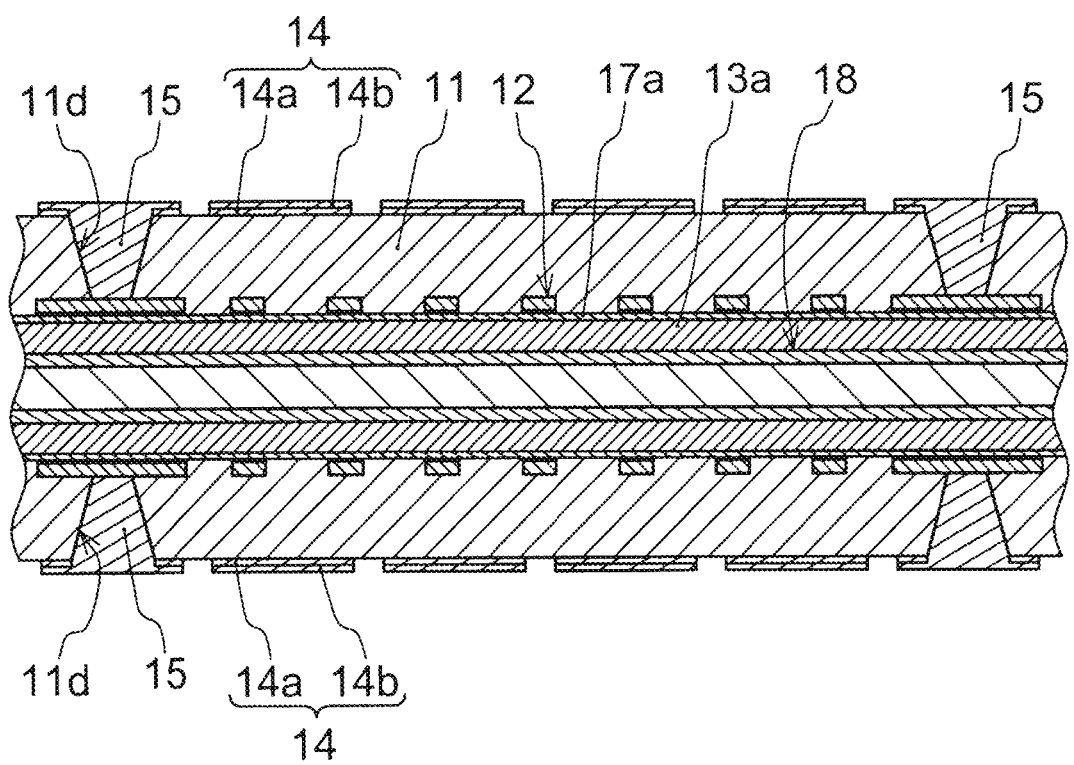
FIG. 6F is an explanatory cross-sectional view illustrating a process of the method for manufacturing the printed wiring board illustrated in FIG. 3.

Next, a metal coating such as an electroless plating film or the like (not illustrated in the drawings) is formed in the through hole (11d) and on the metal foil (14a). As illustrated in FIG. 6F, for example, by electroplating, the via conductor 15 is formed, and a layer of a metal coating (not illustrated in the drawings) and an electroplating film (14b) is formed on the surface of the metal foil (14a). The second conductor layer 14 is formed by the metal foil (14a) and the metal coating (not illustrated in the drawings) and the electroplating film (14b). Then, the metal coating (not illustrated in the drawings) and the metal foil (14a) are patterned and the second conductor layer 14 that includes three layers is formed, and this state is illustrated in FIG. 6F. The formation of the second conductor layer 14 by patterning is performed by forming a normal resist film, patterning and etching.

Figure 6G:
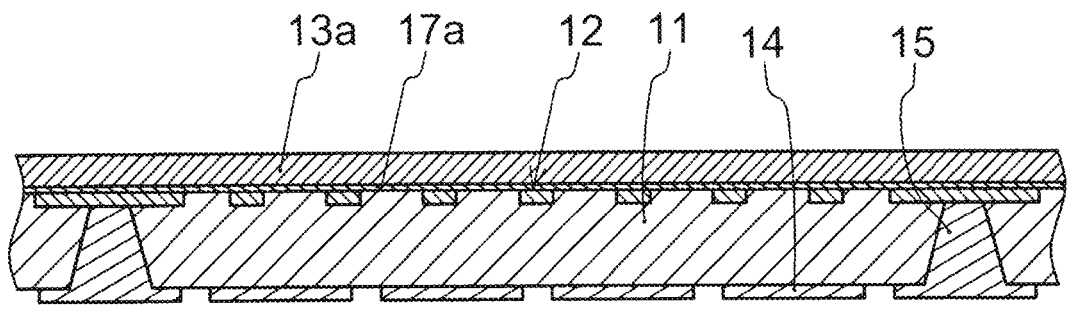
FIG. 6G is an explanatory cross-sectional view illustrating a process of the method for manufacturing the printed wiring board illustrated in FIG. 3.

As illustrated in FIG. 6G, the carrier 18 is removed. In FIG. 6G, for clarity of the description, only the upper side of the carrier 18 illustrated in FIG. 6F is illustrated with up and down being inverted in the drawing. As described above, the carrier 18 (carrier copper foil (18b)) and the metal film (13a) are fixed to each other by an easily separable adhesive or the like such as a thermoplastic resin, and thus can be easily separated from each other by peeling one from the other in a state in which the temperature has been raised, and a surface of the metal film (13a) that is in contact with the carrier copper foil (18b) is exposed.

Figure 6H:
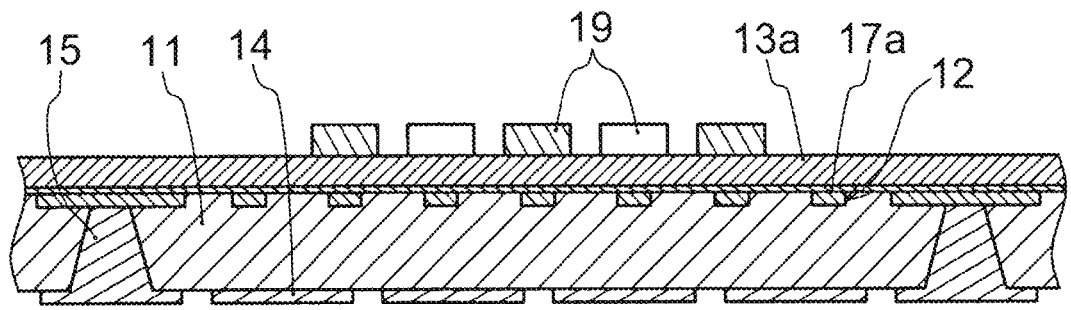
FIG. 6H is an explanatory cross-sectional view illustrating a process of the method for manufacturing the printed wiring board illustrated in FIG. 3.
Figure 6I:
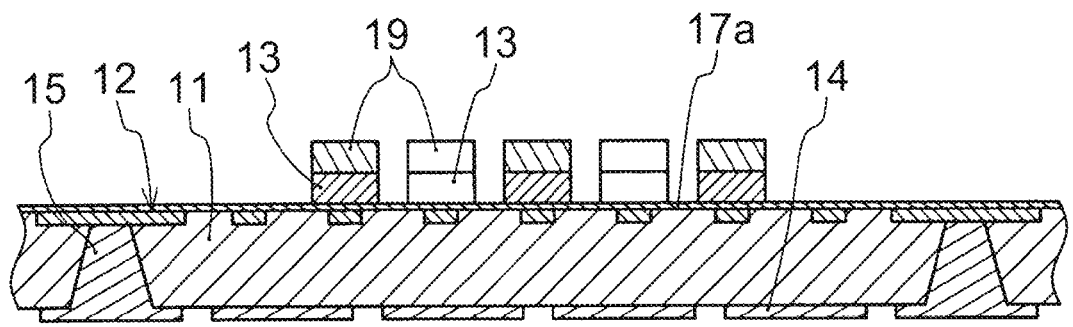
FIG. 6I is an explanatory cross-sectional view illustrating a process of the method for manufacturing the printed wiring board illustrated in FIG. 3.
Figure 6J:
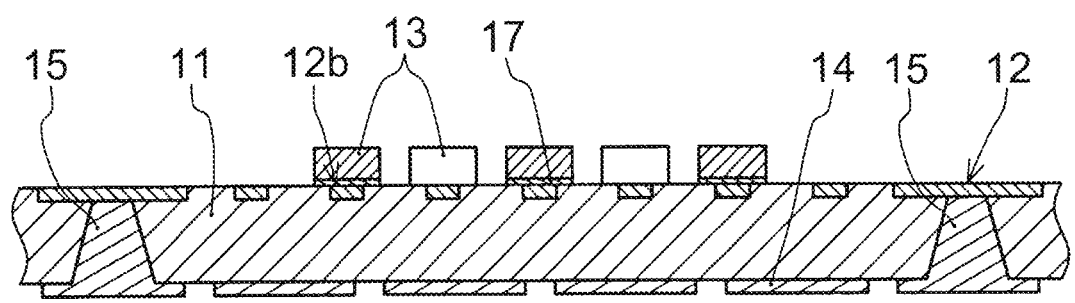
FIG. 6J is an explanatory cross-sectional view illustrating a process of the method for manufacturing the printed wiring board illustrated in FIG. 3.

As illustrated in FIG. 6H-6J, the metal film (13a) is patterned, and the metal posts 13 are formed (see FIG. 6J). As illustrated in FIG. 6H, the patterning of the metal posts 13 is performed such that the metal posts 13 are formed on the surfaces of the connecting portions (12b) of the wirings (12a) of the first conductor layer 12 (see FIG. 5A) via the barrier metal layer 17 in an example illustrated in FIG. 6J.

For example, a mask 19 that is made of a solder plating film is patterned and formed. A portion exposed from the mask 19 that is made of the solder plating film is etched. Thereby, the metal posts 13 are formed in a predetermined patterned (see FIG. 6I). In doing so, a side of each of the metal posts 13 is slightly smaller than a width of the mask 19 that is made of the solder plating film. However, the etching stops on the first conductor layer 12 side due to the barrier metal layer 17 that is formed on the surface of the first conductor layer 12, and thus the first conductor layer 12 is not unnecessarily etched. As in the above-described embodiments illustrated in FIGS. 1 and 2, when the barrier metal layer 17 is not provided, the etching is stopped at the same time as when the patterning of the metal film (13a) is finished (the structure of FIG. 1). On the other hand, in order to ensure that the metal film (13a) does not remain, it is preferable that the etching be slightly excessively performed (the embodiment of FIG. 2).

Thereafter, the mask 19 that is made of the solder plating film can be kept and used as a bonding material. However, it is also possible that, instead of the solder plating film, a normal resist film is formed as a mask, and the mask 19 is removed after the formation of the metal posts 13. FIG. 6J illustrates an example of a structure in which the mask 19 is removed.

As described above, the metal posts 13 can be formed to have various shapes depending on a shape of the mask 19. However, in the embodiments illustrated in FIG. 1-3, the width (w1) of the metal posts 13 is larger than the width (w2) of the connecting portions (12b) of the wirings (12a). That is, as described above, by making the width of the metal posts 13 larger, even for narrow wirings positioned at a fine pitch, the connecting portions that connect to an electronic component or the like can be ensured.

Next, when an electronic component is mounted, to protect the surface of the resin insulating layer 11, the solder resist layer 16 is applied to the first conductor layer 12 other than the connecting portions (12b) on which the electronic component is mounted, the first surface (11a) of the resin insulating layer 11, and the second surface (11b) of the resin insulating layer 11, and the solder resist layer 16 is formed, and the structures illustrated in FIG. 1-3 are obtained. The solder resist layer 16 is formed, for example, by allying a solder resist over the entire surface and patterning using a photolithography technique.

Thereafter, although not illustrated in the drawings, exposed surfaces of the metal posts 13 and the second conductor layer 12 are subjected to a surface treatment using coatings such as OSP, Ni/Au, Ni/Pd/Au, and Sn.

As described above, according to the present embodiment, the printed wiring board 1 having the metal posts 13 that project from the surface (first surface) of the resin insulating layer 11 is manufactured. The wirings (12a) of the first conductor layer 12 are electrically connected to an electronic component (not illustrated in the drawings) via the metal posts 13. Even when warpage repeatedly occurs in the printed wiring board 1, the metal posts 13 can relax a stress that is due to the warpage and acts on the printed wiring board 1. Therefore, the connecting portions between the electronic component and the wirings (12a) of the first conductor layer 12 are unlikely to break and a connection failure is unlikely to occur.

On the other hand, as is clear from the above-described manufacturing method, the metal posts 13 are formed by only patterning the metal film (13a) that is formed on the surface of the copper-clad carrier. Even in a printed wiring board in which the metal posts 13 are not provided, the metal film (13a) may be required as a base layer for forming the first conductor layer 12 and completely removed. In the above embodiment, it is preferable that the metal film (13a) be used that is slightly thicker than a metal film that might have been completely removed by etching. However, by just allowing a portion to remain, a thermal stress due to heat cycles during use can be relaxed. In other words, although only a patterning process is added, without requiring any additional material, an innovative effect is achieved.

Further, according to the manufacturing method of the above embodiment, the metal posts 13 are formed by patterning the metal film (13a). Therefore, during the formation of the mask for the patterning, the size of the metal posts 13 can be adjusted. Therefore, even in a case where, for example, when an electronic component is mounted, warpage occurs in the resin insulating layer 11 and differences in spacing occur between multiple electrode pads of the electronic component and patterns of the wirings (12a) of the first conductor layer 12, this trend can be predicted in advance. Therefore, a metal post 13 of a first pattern (22a) in a portion where the spacing is wide can be patterned to have a small diameter and a metal post 13 of a wiring (12a) in a portion where the spacing the narrow can be patterned to have a large diameter. By doing so, when an electronic component is mounted, even when a solder reflow temperature rises so that warpage occurs in the resin insulating layer 11, all of the electrode pads can be surely connected. Further, according to the present embodiment, the barrier metal layer 17 is provided on the lower side of the metal posts 13. Therefore, for any shape that the metal posts 13 may be formed to have, the first conductor layer 12 is not etched and is not damaged.

In the embodiments illustrated in FIG. 1-3, the printed wiring board is illustrated having a two-layer structure in which a pair of conductor layers (the first conductor layer 12 and the second conductor layer 14) are formed across the single-layer resin insulating layer. However, it is also possible that, for example, after the second conductor layer 14 illustrated in FIG. 6F is formed, a second resin insulating layer and a second metal foil are further laminated on the exposed surfaces of the second conductor layer 14 and the resin insulating layer 11 in a manner illustrated in FIG. 6E, and thereafter the process of FIG. 6G and subsequent processes are performed, thereby forming a printed wiring board having a three-layer structure.

In a printed wiring board, a surface of a place other than where an electronic component is mounted may be protected by forming a solder resist layer in the place. However, in a case where a circuit pattern is embedded on one side of an insulating substrate and a circuit pattern is formed on a surface, rather than being embedded, on the other side of the insulating substrate, a thickness of the solder resist layer on the one side is thinner than a thickness of the solder resist layer on the other side by an amount corresponding to a thickness of the circuit pattern. When volumes of the solder resist layers that are formed on the upper and lower surfaces of the insulating substrate are different, warpage occurs in the insulating substrate due to rise and fall of temperature. There is a problem that, in the case where warpage occurs, for example, when an electronic component is mounted using solder bumps, a difference in height occurs between electrode pads of the electronic component and pads of the circuit pattern that is embedded in the insulating substrate, causing a connection failure to occur, or, peeling occurs in the connection between the electronic component and the circuit pattern because of heat cycles in which rise and fall of the temperature are repeated due to operation and nonoperation after the printed wiring board is incorporated in a product, and thus the reliability is reduced.

A printed wiring board according to an embodiment of the present invention is a highly reliable printed wiring board that allows an electronic component to reliably connected when the electronic component is mounted to a portion of the printed wiring board using solder bumps or the like and in which a connecting portion is unlikely to break even when a heat cycle is repeated due to rise and fall of temperature at a stage where the printed wiring board is incorporated in an electronic device and is used, and another embodiment of the present invention is a method for manufacturing such a printed wiring board.

A printed wiring board according to an embodiment of the present invention is formed to have a structure in which, even when wirings are thin and an interval between the wirings is narrow due to advancement in high density and high integration, adhesion of the wirings is improved, and an electronic component or the like is reliably connected and a contact incident between adjacent wirings is unlikely to occur, and another embodiment of the present invention is a method for manufacturing such a printed wiring board.

A printed wiring board according to an embodiment of the present invention includes: a resin insulating layer that has a first surface and a second surface that is on an opposite side of the first surface; a first conductor layer that is embedded on the first surface side of the resin insulating layer and includes multiple wirings and connecting portions, the connecting portions being respectively portions of the wirings and an electronic component being electrically connected to the connecting portions; a second conductor layer that is formed projecting from the second surface of the resin insulating layer; a via conductor that is provided to penetrate through the resin insulating layer and electrically connects the first conductor layer and the second conductor layer; and a solder resist layer that is formed on the first surface of the resin insulating layer and on the first conductor layer and has an opening for exposing the respective connecting portions of the wirings. Metal posts are respectively provided on the connecting portions that are exposed from the opening; the metal posts are formed to have a width larger than a width of a respective one of the wirings having the connecting portions; and the connecting portions are positioned side by side on every other adjacent wiring.

A method for manufacturing a printed wiring board according to another embodiment of the present invention includes: providing a metal film on a carrier that has a carrier metal; forming a first conductor layer that includes multiple wirings and connecting portions, the wirings being provided on the metal film directly or via another layer, the connecting portions being respectively portions of the wirings, an electronic component being connected on the connecting portions; forming a resin insulating layer on the metal film such that the first conductor layer is embedded therein; forming a through hole that penetrates through the resin insulating layer from an exposed surface side of the resin insulating layer to expose the first conductor layer; filling the through hole with a conductor and forming a second conductor layer the exposed surface side of the resin insulating layer; removing the carrier to expose one surface of the metal film; etching the metal film such that metal posts are respectively formed on the connecting portions of the wirings, the metal posts having a width larger than a width of the wirings of the connecting portions; and forming a solder resist layer on the first surface side of the resin insulating layer, the solder resist layer having an opening such that the metal posts are exposed. In forming the first conductor layer, the first conductor layer is formed such that the connecting portions are positioned side by side on every other adjacent wiring.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer;
   a first conductor layer embedded into a first surface of the resin insulating layer and comprising a plurality of wirings such that the plurality of wirings includes a plurality of connecting portions positioned to connect an electronic component, respectively;
   a second conductor layer projecting from a second surface of the resin insulating layer on an opposite side with respect to the first surface of the resin insulating layer;
   a solder resist layer formed on the first surface of the resin insulating layer such that the solder resist layer is covering the first conductor layer and has an opening structure exposing the connecting portions of the wirings; and
   a plurality of metal posts formed on the plurality of connecting portions respectively such that each of the metal posts has a width which is larger than a width of a respective one of the wirings having the connecting portions,
   wherein the plurality of wirings is formed such that the connecting portions are positioned side by side on every other adjacent one of the wirings.

2. The printed wiring board according to claim 1, further comprising:
   a via conductor formed in the resin insulating layer such that the via conductor is penetrating through the resin insulating layer and connecting the first conductor layer and the second conductor layer.

3. The printed wiring board according to claim 1, wherein each of the metal posts has a first end portion in contact with a respective one of the connecting portions such that the first end portion has a width which is greater than a width of a second end portion on an opposite end.

4. The printed wiring board according to claim 3, wherein each of the metal posts has a curved side surface curving from the first end portion to the second end portion.

5. The printed wiring board according to claim 1, wherein the first conductor layer has a recessed portion on which the metal posts are not formed such that the recessed portion is recessed with respect to the first surface of the resin insulating layer.

6. The printed wiring board according to claim 1, wherein the plurality of wirings is formed such that the plurality of connecting portions is arrayed in a zigzag pattern shifted at a constant pitch.

7. The printed wiring board according to claim 1, wherein each of the wirings has a first portion and a second portion such that the first portion is positioned between two connecting portions positioned side by side on every other adjacent one of the wirings and has a width which is smaller than the second portion.

8. The printed wiring board according to claim 1, wherein each of the wirings has a first portion and a second portion such that the second portion has a respective one of the connecting portions and a width which is greater than the first portion.

9. The printed wiring board according to claim 1, further comprising:
a barrier metal layer formed between the first conductor layer and the plurality of metal posts such that the barrier metal layer comprises a metal material which is different from a metal material forming the first conductor layer and a metal material forming the metal posts.

10. The printed wiring board according to claim 1, wherein the plurality of metal posts comprise a plurality of metal foil portions, respectively, and the first conductor layer comprises a plated metal film layer.

11. The printed wiring board according to claim 1, wherein each of the metal posts has a thickness of 10 μm or greater.

12. The printed wiring board according to claim 1, wherein the opening structure of the solder resist layer comprises an opening portion exposing the plurality of the connecting portions of the first conductor layer.

13. The printed wiring board according to claim 1, wherein the opening structure of the solder resist layer comprises a plurality of opening portions exposing the plurality of the connecting portions of the first conductor layer, respectively.

14. A method for manufacturing a printed wiring board, comprising:
laminating a metal film on a carrier comprising a carrier metal layer such that the metal film is laminated on a surface of the carrier metal layer;
forming a first conductor layer on the metal film such that the first conductor layer includes a plurality of wirings including a plurality of connecting portions positioned to connect an electronic component;
forming a resin insulating layer on the metal film such that the first conductor layer is embedded into a first surface of the resin insulating layer;
forming a second conductor layer on a second surface of the resin insulating layer on an opposite side of the resin insulating layer with respect to the first layer;
removing the carrier from the metal film such that a surface of the metal film is exposed;
etching the metal film such that a plurality of metal posts is formed on the connecting portions of the wirings, respectively, and each of the metal posts has a width which is larger than a width of a respective one of the wirings having the connecting portions; and
forming a solder resist layer on the first surface of the resin insulating layer such that the solder resist layer covers the first conductor layer and has an opening structure exposing the plurality of metal posts,
wherein the forming of the first conductor layer comprises forming the plurality of wirings such that the connecting portions are positioned side by side on every other adjacent one of the wirings.

15. The method for manufacturing a printed wiring board according to claim 14, wherein the forming of the second conductor layer comprises forming a through hole penetrating through the resin insulating layer and reaching the first conductor layer, filling a conductor material into the through hole and forming a second conductor layer on the second surface of the resin insulating layer such that a via conductor connecting the first conductor layer and the second conductor layer is formed through the resin insulating layer.

16. The method for manufacturing a printed wiring board according to claim 14, wherein the etching of the metal film comprises etching the first conductor layer such that a portion of the first conductor layer on which the metal posts are not formed is recessed with respect to the first surface of the resin insulating layer.

17. The method for manufacturing a printed wiring board according to claim 15, further comprising:
forming a barrier metal layer on an entire surface of the metal film prior to the forming of the first conductor layer such that the barrier metal layer comprises a metal material which is different from a metal material forming the first conductor layer and a metal material forming the metal film.

18. The method for manufacturing a printed wiring board according to claim 14, wherein the metal material forming the plurality of metal posts comprises copper, and the metal material of the barrier metal layer comprises one of nickel and titanium.

19. The method for manufacturing a printed wiring board according to claim 14, wherein the metal film comprises a metal foil such that the plurality of metal posts comprise a plurality of metal foil portions, respectively, and the first conductor layer comprises a plated metal film layer.

20. The method for manufacturing a printed wiring board according to claim 14, wherein the forming to the metal posts comprises forming the metal posts such that each of the metal posts has a thickness of 10 μm or greater.

* * * * *